United States Patent [19]

Nashashibi

[11] Patent Number: 5,170,229
[45] Date of Patent: Dec. 8, 1992

[54] JUNCTION FIELD EFFECT TRANSISTORS WITH INJECTOR REGION

[75] Inventor: Tawfic S. Nashashibi, Egham, England

[73] Assignee: Link Analytical Limited, High Wycombe, Great Britain

[21] Appl. No.: 728,796

[22] Filed: Jul. 9, 1991

Related U.S. Application Data

[63] Continuation of Ser. No. 195,217, May 18, 1988, abandoned.

[30] Foreign Application Priority Data

Jan. 16, 1988 [GB] United Kingdom ............... 8800949

[51] Int. Cl.5 .................. H01L 29/80; H01L 29/10; H01L 29/74
[52] U.S. Cl. ................... 257/273; 257/270; 257/212
[58] Field of Search .............. 357/22 A, 22 B, 22 C, 357/22 D, 22 E, 22 F, 22 G, 22 H, 22 I, 22 J, 22 K, 22 GR, 22 LA, 22 P, 22 S, 22 MD, 22 V, 23.4, 38, 22, 92

[56] References Cited

U.S. PATENT DOCUMENTS 3,183,128 5/1965 Leistiko et al. ............ 357/22 F
3,755,012 8/1973 George et al. ............. 148/175
3,999,207 12/1976 Arai ...................... 357/22 R

FOREIGN PATENT DOCUMENTS 2847822 5/1979 European Pat. Off. ........ 357/22 E
5252267 12/1978 Japan ..................... 357/22 G

OTHER PUBLICATIONS

Radeka, V., *Overload Recovery Circuit for Charge Amplifiers*, I.E.E.E. Transactions on Nuclear Science, vol. 17, Feb. 1970, pp. 269–275.

Elad, E., *Drain Feedback A Novel Feedback Technique for Low Noise Cryogenic Preamplifiers*, 18th Nuclear Science Symposium, Feb. 1972, pp. 403–411.

Primary Examiner—William Mintel
Assistant Examiner—Wael Fahmy
Attorney, Agent, or Firm—Cooper & Dunham

[57] ABSTRACT

An Injector Junction Field Effect Transistor (IJFET) is disclosed which, in addition to having two gates (G1, G2) a drain (D) and a source (S), also has an injector (I). The device may be used as a high impedance charge or current amplifier in, for example, an x-ray fluorescence device. On applying current to the injector carriers are introduced into the channel of the device allowing a small gate leakage current to flow to restore charge to the input. A small restore current is therefore controllable by low impedance injector circuits.

14 Claims, 2 Drawing Sheets

JUNCTION FIELD EFFECT TRANSISTORS WITH INJECTOR REGION

This is a continuation of application Ser. No. 07/195,217 (now abandoned), filed May 18, 1988.

BACKGROUND OF THE INVENTION

The present invention relates to junction field effect transistors.

Junction field effect transistor (JFET) devices are used as charge amplifiers because they may be designed with a very high input impedance. Charge amplifiers are required to amplify the output from transducers of the type which produce small charge or current signals. Transducers of this type include, for example, those sensitive to ionising radiation such as gamma rays and x-trays. In x-ray fluorescence equipment, for example, x-rays (generated by an x-ray tube or as a result of electron bombardment in an electron microscope) are analysed to determine the elemental composition of a specimen. Equipment of this type is disclosed in the Applicants co-pending UK Patent Application No. 8718531 (LA2).

Usually an FET is used as the first stage of a charge amplifier which feeds other amplifier stages to produce an amplified charge signal which is in turn supplied to a processing unit. The processing unit is arranged to measure the charge signal to provide information relating to the conditions experienced by the transducer. Given that it is usual for the charge signal to change increase say, in only one direction the accumulated charge must be removed before the system starts to saturate and become non-linear; a process commonly known as restore.

A problem with restoring charge amplifiers, as described above, is that the amount of accumulated charge is often very small thus the required restore current may be a few nano amps required for less than ten micro seconds. The existance of stray capacitance in any electronic system makes direct control of a current this size virtually impossible over such a small time scale.

A known solution to the problem removing charge from amplifiers of the aforesaid type is that of "pulsed optical restore" as described in UK Patent No. 1153374. In this system an accumulated charge is discharged by a light responsive semiconductor device which in turn receives light from a light emitting semiconductor device. A short pulse of relatively high current is directly applied to the light emitting device, however, the current generated by the light responsive device (positioned as close as possible to the accumulated) charge to minimise the effect of stray capacitance, is several orders of magnitude smaller than the first current.

A problem with pulsed optical restore is that, in many applications (including x-ray fluorescence), light from the light emitting device must not reach the input transducer, x-ray detector say. However shielding placed between the transducer and the light emitting device introduces capacitance. This problem is partially solved by arranging the light shield to be part of a feedback capacitance, however, opaque materials suitable for this application do not have good dielectric properties and a introduce noise.

A further problem with pulsed optical restore is that the light sensitive device introduces another stray capacitance. This problem may be overcome by designing the FET itself to be sensitive to light and then directing the restore light onto the FET. However such an approach causes charge to build up on the FET and additional time may be required to remove this charge before measurements may be taken.

SUMMARY OF THE INVENTION

It is an object of the present invention to provide an improved JFET. A further object of the invention is to provide an improved JFET for charge amplification and, in particular, it is an object of the invention to provide a JFET which does not require optical irradiation to remove accumulated charge.

According to a first aspect of the invention there is provided a junction field effect transistor comprising a substrate of a first type of semiconducting material; a layer of a second type of semiconducting material in contact with said substrate forming a channel; a source region, a drain region and a gate region formed in said channel wherein said gate region is modified to said first type of semiconducting material and positioned between said source region and said drain region, and a fourth region modified to said first type of semiconducting material forming an injector for injecting carriers into said layer of second type of semiconducting material.

The transistor is particularly suitable for amplifying charge of small currents. According to a second aspect of the invention there is provided a charge amplifier comprising a capacitance for storing charge from a transducer; a junction field effect transistor, said transistor having a substrate of a first type of semiconducting material, a channel of a second type of semiconducting material, a gate, a source, a drain and an injector; means for supplying the stored output from said transducer to said gate; a threshold detector; means for supplying the output at said drain to said threshold detector, said threshold detector arranged to supply a pulse to said injector when the drain output reaches a predetermined threshold whereby carriers are injected into the channel of said junction field effect transistor to restore charge on said capacitance via the gate of said transistor.

An advantage of the invention is that it provides an amplifier which does not require pulsed optical restore, thus problems associated with irradiating the JFET itself are avoided. The optical properties of shielding, which forms part of the feedback capacitance, are no longer so important thus materials such a PTFE, having good dielectric properties, may be used. Furthermore the JFET may be positioned closer to the transducer thus minimising the effect of capacitance in the connecting wires. The combined effect of these advantages is to reduce noise which in turn provides improved sensitivity.

DESCRIPTION OF THE PREFERRED EMBODIMENT

Figure 1:
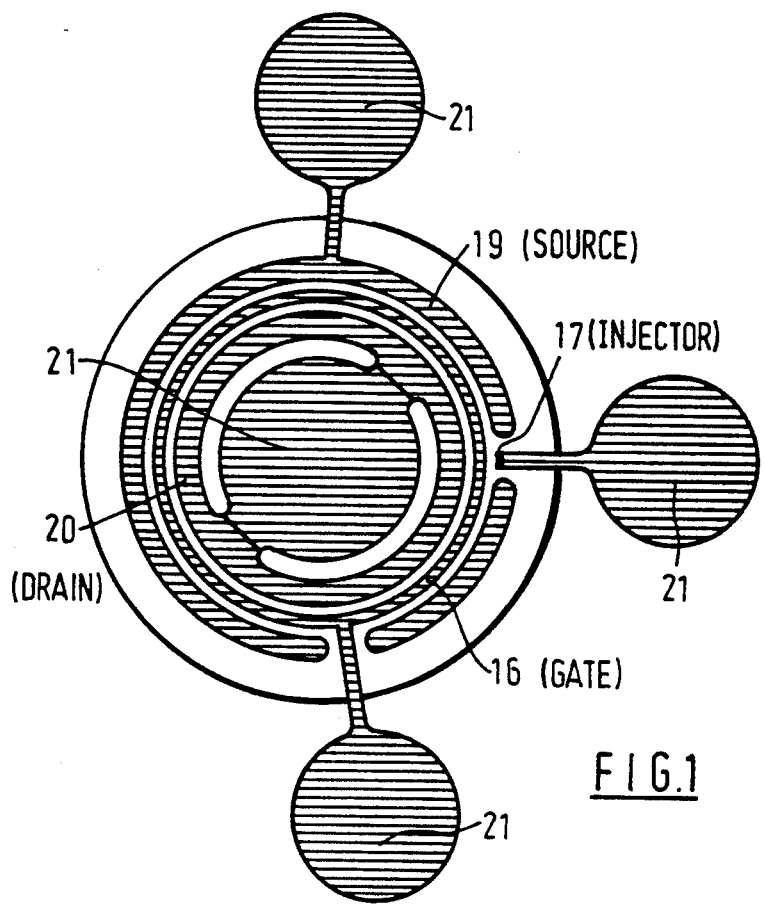
FIG. 1 is a top view of a junction field effect transistor embodying the present invention.
Figure 2:
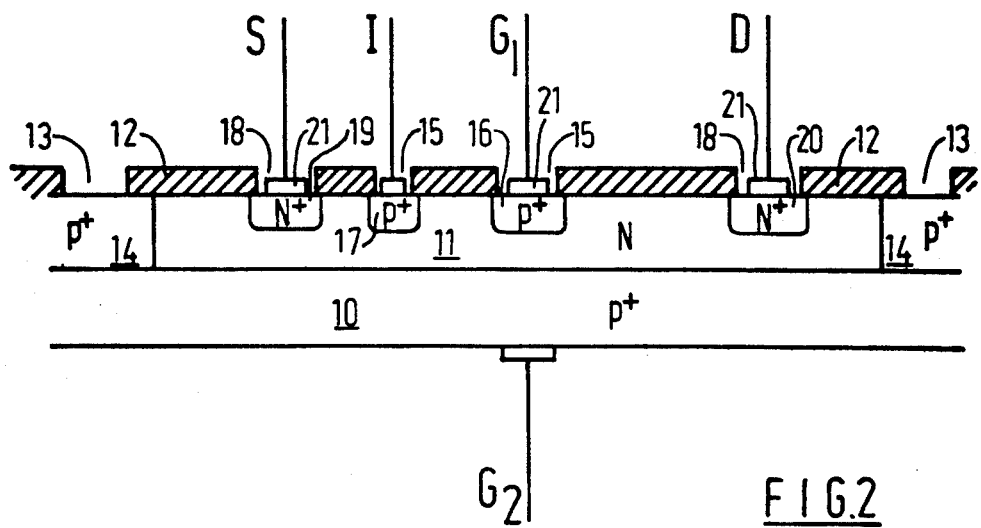
FIG. 2 is a diagrammatic cross section of the transistor shown in FIG. 1.

A top view of a junction field effect transistor is shown in FIG. 1 and a diagrammatic cross section is shown in FIG. 2. An N-channel device is shown but it could equally be a P-channel device: all semiconductor regions being the opposite to that shown.

A plurality of devices are formed on a substrate 10 of heavily doped (p+) silicon. An n-type epitaxial layer 11 is grown onto the substrate 10 to a thickness of five micro metre (forming the channel regions) which are covered by a passivation layer 12 of silicon dioxide. Windows 13 are opened in the oxide layer 12, by a process of photo lithography and etching, and the assembly is introduced to an atmosphere of boron at a temperature between 900 and 1100 degrees C. Boron diffuses into the epitaxial layer forming isolation diffusion regions 14 which isolate each device from others formed on the substrate; the diffusion being deep enough to meet the substrate region 10.

After the isolation regions have been formed additional windows 15 are opened in the oxide layer and regions 16 and 17 of P+ type material are formed either by boron diffusion or boron ion implantation Region 16 provides a top gate in the form of a circular ring as shown in FIG. 1. Region 17 is at the heart of the present invention. It has been termed an injector and is a small region positioned outside the ring of the gate region 16. The properties of the new device, and in particular the effect of this new region, are described below.

The device, which is referred to herein as an injector junction FET (IJFET), is completed in substantially the same way as a conventional JFET. Windows 15 are covered by growing another oxide layer and new windows 18 are opened. Phosphours is diffused to form N+ regions for a source 19 (a ring surrounding the gate) and a drain 20, a ring inside the gate. The previously sealed windows 15 are reopened and a thin layer of aluminum is deposited onto the upper surface of the devices. Most of the aluminum is removed by photo lithography and etching to reveal bonding pads 21, connected to the source (S), gate (G1), drain (D) and injector (I) regions, onto which gold electrodes are connected. A second gate electrode (G2) is connected to the substrate 10 thus each individual device has a total of five electrodes.

The properties of the IJFET as a high impendance amplifier are not affected by the presence of the injector region until (for the n-channel device) a positive bias is applied to said injector. Thus in a first mode operation the device has a high input (gate) impedance and current flow (electrons for the n-channel device) from source to drain is controlled in response to voltage applied to the gate (G1), the gate leakage current is negligible. In a second mode of operation a positive bias is applied to the injector (I) and a forward current passes through the junction between the p type injector 17 and the n-type layer 11. Holes are injected into the n-type layer which in turn allows a relatively small current to leak through the gate G1. Although small, compared to the injected current, the gate leakage current in this second mode is much larger than that experienced in the first mode. Thus any charge which may have built up on the input side of the device during its first mode of operation will be discharged during second mode operation, that is by applying a positive bias to the injector.

Figure 3:
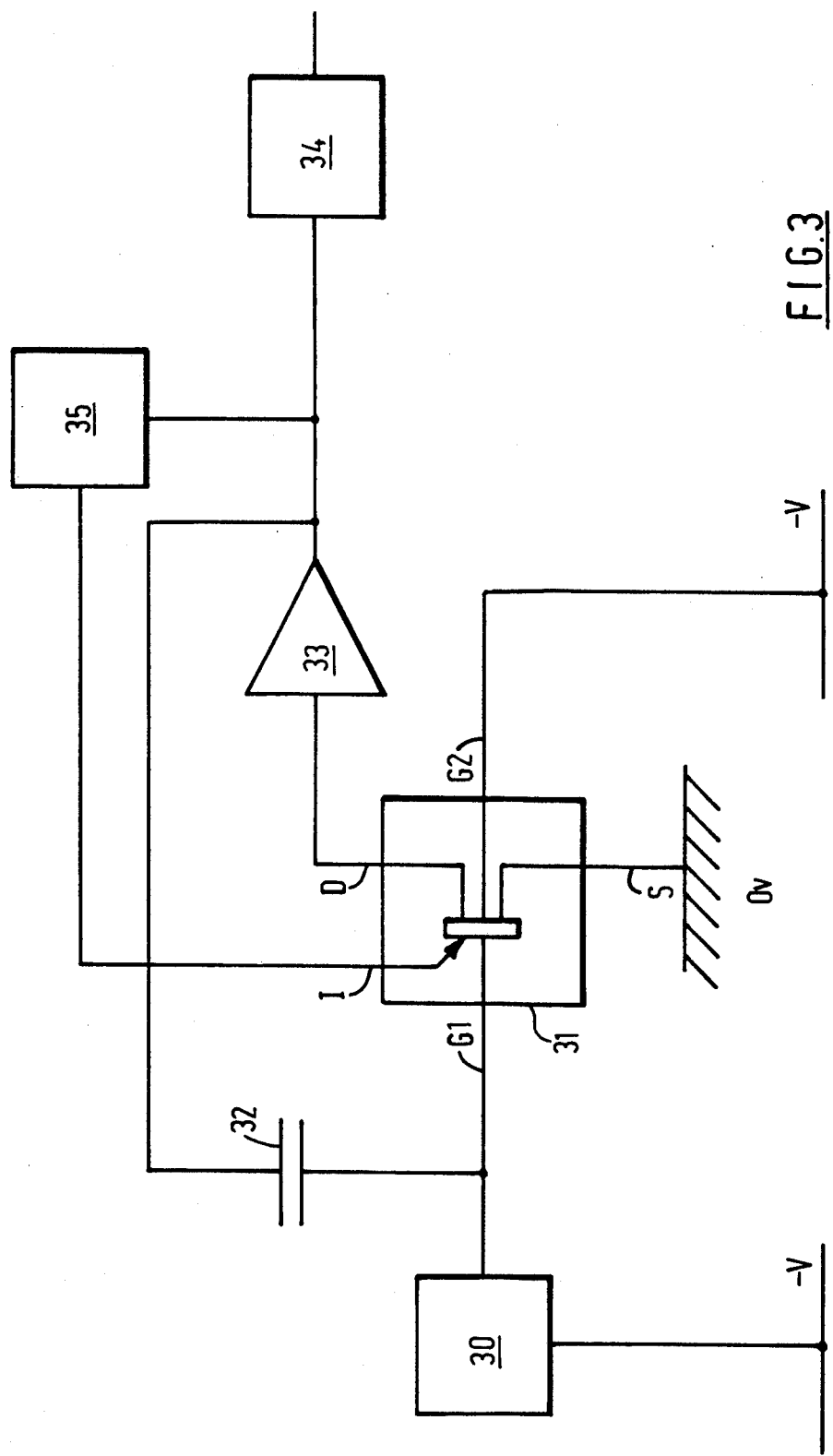
FIG. 3 is a circuit diagram of a charge amplifier based on the transistor shown in FIG. 1.

A charge amplifier is shown in FIG. 3 in which the output from a transducer 30, for example a silicon x-ray detector, is supplied to the gate of an IJFET 31. The symbol adopted for the IJFET is substantially the same as that for a standard dual gate JFET with the addition of an inclined arrow to identify the injector. Operation of the device in its second mode is similar to that of a PNP bipolar transistor in which the injector 17 acts like an emitter, the gate region acts as a collector and the n-type layer (on the source side) acts as a base. The injector has therefore been identified in a manner commonly accepted for that of an emitter, the direction of the arrow being the direction of conventional current required to force the device to operate in its second mode.

The output charge from transducer 30 accumulates on a plate of a feedback capacitor 32 which in turn creates a proportionaly increasing drain current to be supplied to an amplifier 33. The output from amplifier 33 is supplied to a processing unit 34 and to a threshold detector 35. The processing unit 34 produces an output which may be displayed, stored or processed further by a computer or similar device. The threshold detector 35 supplies a predetermined current pulse to the injector I of the IJFET 31 when the amplified signal reaches a predetermined value. The magnitude and duration of the injector pulse is such that the accumulated charge on the capacitor 32 is restored by leakage through the gate G1 of the IJET31.

The IJFET allows a small restore current to be controlled by a much larger injector current without requiring pulsed optical restore. It has particular application in x-ray fluorescence detectors in electron microscopes, gamma ray detectors and other systems in which small currents and charges are amplified.

What we claim is:
1. A device including a JFET comprising:
   a substrate of a first conductivity type, an epitaxial layer which is at one surface of the substrate and is of opposite conductivity type, and a source region, a first gate region and a drain region formed at spaced-apart locations in said epitaxial layer; and
   an injector region formed at said epitaxial layer at a location intermediate said gate and one of said source and drain regions;
   wherein current flows through said first gate region thereby removing accumulated charge via said gate region when a pulse of a selected polarity is applied to the injector region.
2. A device as in claim 1 in which said first gate region and said injector region are formed at respective regions of said epitaxial layer which are doped to the same conductivity type as said substrate.
3. A device as in claim 2 in which said source and drain regions are formed at respective regions of said epitaxial layer which are doped to the same conductivity type as said epitaxial layer but are more conductive than said epitaxial layer.
4. A device as in claim 3 in which a portion of said epitaxial layer, at which portion said source, drain, first gate and injector regions are located, is surrounded by an isolation diffusion well which extends through said epitaxial layer to said substrate.
5. A device as in claim 4, including a second gate contact connected to said substrate.
6. A device as in claim 1 wherein said pulse of a selected polarity comprises a voltage pulse.
7. A device as claimed in claim 1, wherein said injector region injects carriers into said epitaxial layer thereby increasing leakage current through said gate region without changing the source to drain resistance.
8. A device including a JFET comprising:
   a substrate of a first conductivity type, an epitaxial layer which is at one surface of the substrate and is of opposite conductivity type, and a source region, a first gate region and a drain region formed at spaced-apart locations in said epitaxial layer; and an injector region formed at said epitaxial layer at a location intermediate said gate and one of said source and drain regions;

wherein current flows through said first gate region thereby removing accumulated charge via said gate region when a voltage of a selected polarity is applied to the injector region.

9. A device as in claim 8 in which said first gate region and said injector region are formed at respective regions of said epitaxial layer which are doped to the same conductivity type as said substrate.

10. A device as in claim 9 in which said source and drain regions are formed at respective regions of said epitaxial layer which are doped to the same conductivity type as said epitaxial layer but are more conductive than said epitaxial layer.

11. A device as in claim 10 in which a portion of said epitaxial layer, at which portion said source, drain, first gate and injector regions are located, is surrounded by an isolation diffusion well which extends through said epitaxial layer to said substrate.

12. A device as in claim 8, including a second gate contact connected to said substrate.

13. A device as in claim 8, wherein the voltage contact connected to said substrate.

14. A device as in claim 13, wherein said injector region injects carriers into said epitaxial layer thereby increasing leakage current through said gate region without changing the source to drain resistance.

* * * * *